United States Patent
Hosaka

(12) 
(10) Patent No.: US 6,528,354 B1
(45) Date of Patent: Mar. 4, 2003

(54) METHOD OF MANUFACTURING A SEMICONDUCTOR DEVICE

(75) Inventor: Takashi Hosaka, Chiba (JP)

(73) Assignee: Seiko Instruments Inc. (JP)

(*) Notice: Subject to any disclaimer, the term of this patent is extended or adjusted under 35 U.S.C. 154(b) by 0 days.

(21) Appl. No.: 09/941,146

(22) Filed: Aug. 28, 2001

(51) Int. Cl.[7] .............................................. H01L 21/50
(52) U.S. Cl. ...................................................... 438/127
(58) Field of Search ................................. 438/127, 464, 438/114, 762, 763

(56) References Cited

U.S. PATENT DOCUMENTS

| 5,733,802 A | * | 3/1998 | Inoue et al. | 438/127 |
| 5,897,338 A | * | 4/1999 | Kaldenberg | 438/116 |
| 6,008,073 A | * | 12/1999 | King et al. | 438/123 |
| 6,066,514 A | * | 5/2000 | King et al. | 438/118 |
| 6,204,095 B1 | * | 3/2001 | Farnworth | 438/127 |
| 6,228,688 B1 | * | 5/2001 | Otha et al. | 438/127 |
| 2002/0025608 A1 | * | 2/2002 | Shinonaga et al. | 438/127 |

* cited by examiner

*Primary Examiner*—Carl Whitehead, Jr.
*Assistant Examiner*—David S Blum
(74) *Attorney, Agent, or Firm*—Adams & Wilks

(57) ABSTRACT

In the manufacture of semiconductor devices in which a plurality of semiconductor chips are mounted to a substrate, warping of the substrate is prevented by covering a first surface of the substrate with a first resin layer, covering a second surface of the substrate opposite the first surface with a continuous film and covering the continuous film with a second resin layer. Stresses applied to the substrate by the first and second resin layers cancel each other out to prevent warping of the substrate. The second resin layer is removed by peeling the continuous film, so that individual chip die may be removed by dicing the substrate.

11 Claims, 2 Drawing Sheets

METHOD OF MANUFACTURING A SEMICONDUCTOR DEVICE

BACKGROUND OF THE INVENTION

1. Field of the Invention

The present invention relates generally to a method of forming IC packages in which a number of semiconductor chips are mounted on a substrate.

2. Related Background Art

When a number of semiconductor chips are mounted on a substrate 21 and are covered with a resin 25 to be protected, which then is divided into individual semiconductor packages, conventionally, the substrate warps due to the resin which is adhered onto only one side of the substrate as shown in FIG. 2.

As shown in FIG. 2, since the resin 25 is allowed to adhere onto only one side of the substrate, the substrate warps to one side. Hence, in the steps thereafter, it is necessary to work with consideration given to this warp. For instance, sufficient space should be provided so as to prevent upper-side and lower-side substrates from coming to contact with each other when a substrate is to be mounted on a magazine, or the focus of a microscope should be readjusted continuously in inspecting a substrate, which has required extra time and energy. In addition, when a substrate is cut and thereby semiconductor packages are obtained, such warp should be taken into account and the substrate cannot be cut with high precision.

SUMMARY OF THE INVENTION

In order to solve the above-mentioned problems, in the present invention, when semiconductor chips mounted on a substrate are to be covered with resin, resin is also allowed to adhere onto the opposite side of the substrate on which the semiconductor chips are mounted. According to this, comparable levels of resin stress are exerted on respective sides of the substrate. Hence, the stresses exerted on the respective sides cancel each other out and thus the substrate does not warp. The resin that has adhered onto the opposite side of the substrate on which the semiconductor chips are mounted is removed before the substrate is cut.

Figure 1A:
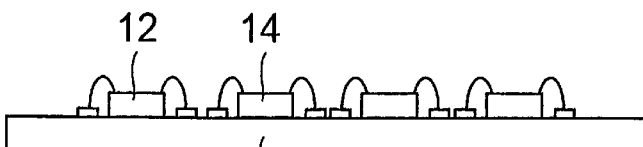
FIGS. 1A to 1F show a manufacturing method of a semiconductor device.according to the present invention.

DETAILED DESCRIPTION OF THE PREFERRED EMBODIMENTS,

The present invention relates to a technique for preventing a substrate from warping in method of manufacturing a semiconductor device including mounting of a number of semiconductor chips on the substrate, covering the semiconductor chips with resin, and dividing the whole into semiconductor packages. An example of the present invention is described with reference to the drawing as follows.

FIG. 1 shows a manufacturing method of the present invention. FIG. 1A is a cross-sectional view illustrating a state where semiconductor chips 12 are mounted on a substrate II and wires inside the substrate 11 and the semiconductor chips 12 are connected with metal lines 14. Examples of the substrate include a glass epoxy substrate, a ceramic substrate, a polyimide substrate, and the like.

Figure 1C:
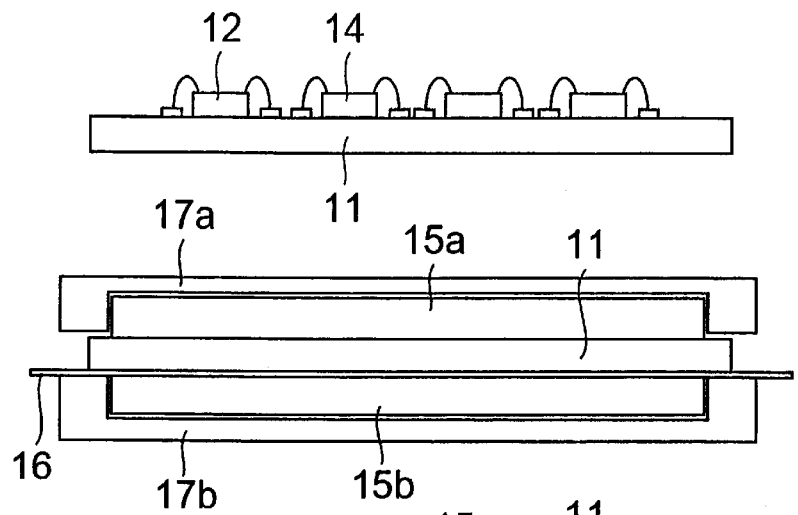
Figure 1D:
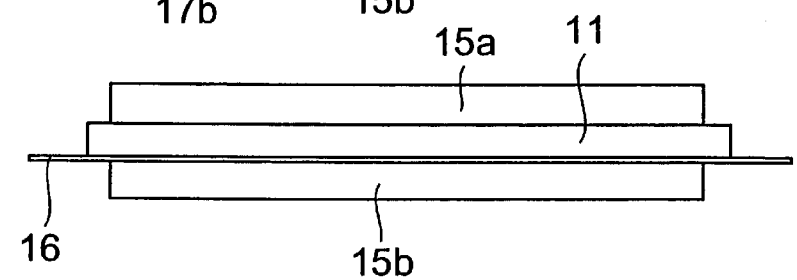
Figure 1E:
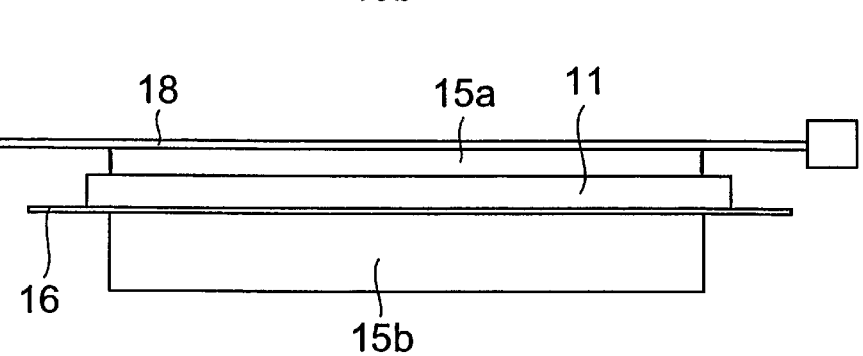
Figure 1B:
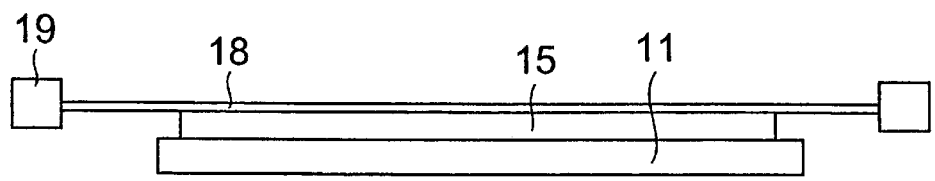

Next, as shown in FIG. 1B, the substrate 11 is placed inside a mold 17 and resins 15a and 15b are poured thereinto and then are solidified. Conventionally, resin was allowed to adhere onto the only side on which the semiconductor chips 12 were provided. In the present invention, however, the resins 15a and 15b are poured on both front and back sides of the substrate 11, respectively. At this time a tape 11 comprising a continuous film is interposed between the substrate 11 and the resin 15b on the side on which the semiconductor chips 12 are not provided. The mold 17 is removed after the resins 15a and 15b are solidified.-IN FIG. 1C shows a state where the front and back sides of the substrate 11 are covered with the resins 15a and 15b, respectively.

Next, as shown in FIG. 1D, the face of the resin 15a on the side on which the semiconductor chips are provided is stuck onto a dicing tape 18. Since the substrate 11 is not warped, it sticks to the dicing tape 18 easily.

Next, the tape 16 is peeled off from the substrate 11. At this time, the resin 15b on the tape side is also peeled off together. This state after the peeling off is shown in FIG. 1E.

Figure 1F:
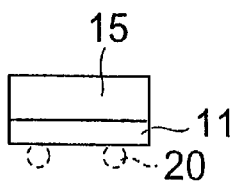
Figure 2:
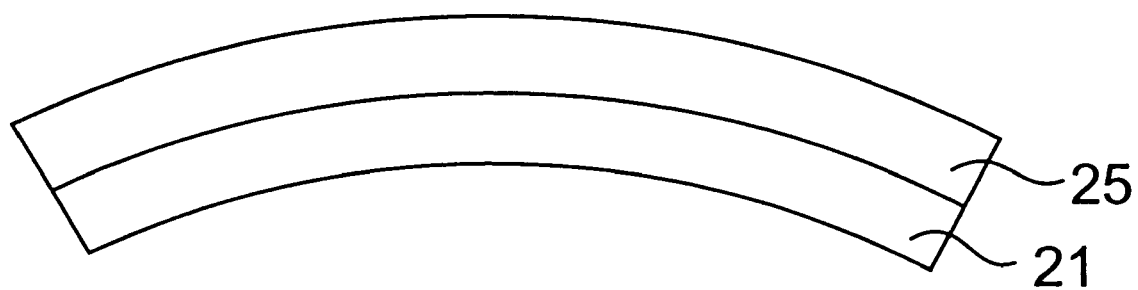
FIG. 2 shows a conventional semiconductor device.

Afterward, the substrate is cut by dicing. Thus, as shown in FIG. 1F, a semiconductor package is obtained that is composed of the substrate 11, the resin 15a, and external electrodes 20.

As described above, since resin is allowed to adhere not only to the side on which the semiconductor chips are mounted but also to the opposite side thereto, the substrate does not warp and thus processes in the steps carried out thereafter can be proceeded easily with no problem being caused. Particularly, it is easy to stick the substrate to the dicing tape before the substrate is cut, and thus the substrate is allowed to adhere completely to the dicing tape to be stuck thereto. In addition, since a tape is interposed between the lower-side face of the substrate and resin on the lower side of the substrate, the resin on the lower side can be removed from the substrate relatively easily after the substrate is stuck to the dicing tape. It is also possible to peel off the tape and resin on the lower side of the substrate after individual semiconductor packages are obtained.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a semiconductor device, comprising the steps of: mounting a plurality of semiconductor chips on a substrate; covering a first surface of the substrate with a first resin layer for protection thereof; covering a second surface of the substrate opposite the first surface with a continuous film; covering the continuous film with a second resin layer so that stresses applied to the substrate by the first and second resin layers cancel each other out to prevent warping of the substrate; and peeling the continuous film to remove the second resin layer.

2. A method of manufacturing a semiconductor device according to claim 1; wherein the semiconductor chips are mounted on the first surface of the substrate.

3. A method of manufacturing a semiconductor device according to claim 1; wherein the step of covering a second surface of the substrate with a continuous film comprises applying a layer of tape to the second surface of the substrate.

4. A method of manufacturing a semiconductor device according to claim 3; further comprising the step of providing a dicing tape on an exposed surface of the first resin layer.

5. A method of manufacturing a semiconductor device according to claim 1; further comprising the step of providing a dicing tape on an exposed surface of the first resin layer.

6. A method of manufacturing a semiconductor device comprising the steps of: mounting at least one semiconductor device on a first surface of a substrate; covering the substrate with resin layers on the first surface and a second surface opposite the first surface so that opposite stresses are applied to the substrate by the resin layers to prevent warping of the substrate; and removing at least one of the resin layers.

7. A method of manufacturing a semiconductor device according to claim 6; wherein the step of mounting at least one semiconductor device comprises mounting a plurality of semiconductor chips on the first surface of the substrate.

8. A method of manufacturing a semiconductor device according to claim 7; further comprising the step of providing a dicing tape on an exposed surface of one of the resin layers.

9. A method of manufacturing a semiconductor device according to claim 8; further comprising the step of dicing the substrate so that the semiconductor chips are individually removable from the dicing tape after removing at least one of the resin layers.

10. A method of manufacturing a semiconductor device according to claim 6; wherein the step of removing at least one of the resin layers comprises the steps of adhering a layer of tape on a surface of the substrate prior to forming the resin layer thereon, and peeling the tape to remove the resin layer.

11. A method of manufacturing a semiconductor device comprising the steps of: mounting a plurality of semiconductor devices on a first surface of a substrate; providing a layer of tape on a second surface of the substrate opposite the first surface; covering the first surface of the substrate with a first resin layer; covering the layer of tape with a second resin layer so that opposite stresses are applied to the substrate by the first and second resin layers; providing a dicing tape on an exposed surface of the first resin layer; peeling the layer of tape to remove the second resin layer; and dicing the substrate so that the semiconductor devices are individually removable from the dicing tape.

* * * * *